United States Patent
Luo et al.

(10) Patent No.: US 10,804,177 B2
(45) Date of Patent: Oct. 13, 2020

(54) WAFER-LEVEL PACKAGING METHOD AND PACKAGE STRUCTURE THEREOF

(71) Applicant: Ningbo Semiconductor International Corporation, Ningbo (CN)

(72) Inventors: Hailong Luo, Ningbo (CN); Clifford Ian Drowley, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 0 days.

(21) Appl. No.: 16/230,224

(22) Filed: Dec. 21, 2018

(65) Prior Publication Data

US 2020/0075443 A1 Mar. 5, 2020

Related U.S. Application Data

(63) Continuation of application No. PCT/CN2018/113106, filed on Oct. 31, 2018.

(30) Foreign Application Priority Data

Sep. 4, 2018 (CN) .......................... 2018 1 1027608

(51) Int. Cl.
| | |
|---|---|
| *H01L 21/50* | (2006.01) |
| *H01L 23/31* | (2006.01) |
| *H01L 21/56* | (2006.01) |
| *H01L 23/538* | (2006.01) |
| *H01L 23/00* | (2006.01) |
| *H01L 25/065* | (2006.01) |

(52) U.S. Cl.
CPC .......... *H01L 23/3114* (2013.01); *H01L 21/56* (2013.01); *H01L 23/3121* (2013.01); *H01L 23/5384* (2013.01); *H01L 24/09* (2013.01); *H01L 25/0652* (2013.01)

(58) Field of Classification Search
CPC . H01L 21/56; H01L 23/3114; H01L 23/5384; H01L 23/3121; H01L 24/09; H01L 25/0652
USPC ........................................................ 438/108
See application file for complete search history.

(56) References Cited

U.S. PATENT DOCUMENTS

| 5,988,485 A | 11/1999 | Master et al. |
| 6,962,835 B2 * | 11/2005 | Tong ................. H01L 21/76251 |
| | | 438/108 |

(Continued)

FOREIGN PATENT DOCUMENTS

JP 2006513579 A 4/2006

*Primary Examiner* — Luan C Thai
(74) *Attorney, Agent, or Firm* — Anova Law Group, PLLC

(57) ABSTRACT

A wafer-level packaging method and a package structure are provided. In the method, a first wafer is provided having first chips formed there-in. A surface of each first chip is integrated with a first electrode. A first dielectric layer is formed on the first wafer to expose each first electrode. Second chips are provided with a surface of each second chip integrated with a second electrode. A second dielectric layer is formed on the plurality of second chips to expose each second electrode. The second dielectric layer is positioned relative to the first dielectric layer. The second chips are bonded to the first wafer with each second chip aligned relative to one first chip to form a cavity there-between. A chip interconnection structure is formed in the cavity to electrically connect the first electrode with the second electrode. An encapsulation layer covers the second chips.

20 Claims, 3 Drawing Sheets

(56) References Cited

U.S. PATENT DOCUMENTS 9,570,429 B2 * 2/2017 Mao .................... H01L 25/0657
2005/0263888 A1 12/2005 Jiang et al.

* cited by examiner

WAFER-LEVEL PACKAGING METHOD AND PACKAGE STRUCTURE THEREOF

CROSS-REFERENCES TO RELATED APPLICATIONS

This application is a continuation application of PCT Patent Application No. PCT/CN2018/113106, filed on Oct. 31, 2018, which claims the priority to Chinese patent application No. 201811027608.8, filed on Sep. 4, 2018, the contents of all of which are incorporated herein by reference in their entirety.

FIELD OF THE DISCLOSURE

The present disclosure generally relates to the field of semiconductor technology and, more particularly, relates to a wafer-level packaging method and a package structure.

BACKGROUND

With continuous development of large scale integrated circuits, the feature dimensions of the integrated circuits (ICs) have been continuously decreasing. Accordingly, there are increased demands on the packaging technology of the ICs. Current packaging technology includes ball grid array (BGA) package, chip scale package (CSP), wafer-level package (WLP), three-dimensional (3D) package, and system in package (SiP), etc.

For IC packaging with lower manufacturing cost and higher reliability, speed, and density, advanced packaging method mainly adopts wafer-level system-in package (WL-SiP). Compared with the conventional system in package (SiP), the WLSiP packaging method completes a packaging integration process on a wafer, thereby significantly reducing the area of the package structure, lowering manufacturing cost, optimizing electronic performance, and batch processing, etc. Labor amount and equipment requirements are therefore significantly reduced.

WLSiP packaging method mainly includes two important processes: physical connections and electrical connections. These include, for example, using a bonding process to physically bond a chip to be integrated to a wafer; using an electroplating process to electrically connect semiconductors; and using a through-silicon via (TSV) process to electrically connect a chip with external electric circuits.

The current packaging method of WLSiP needs to be further simplified and improved.

BRIEF SUMMARY OF THE DISCLOSURE

One aspect of the present disclosure provides a wafer-level packaging method. In the method, a first wafer is provided. A plurality of first chips is formed in the first wafer. A surface of each first chip is integrated with a first electrode. A first dielectric layer is formed on the surface of the first wafer exposing each first electrode. A plurality of second chips is provided. A surface of each second chip is integrated with a second electrode. A second dielectric layer is formed on the plurality of second chips on the surface that the second electrode is integrated, exposing each second electrode. The second dielectric layer is positioned relative to the first dielectric layer. The second chips are bonded with the wafer with each second chip aligned relative to one first chip, forming a cavity between the first and the second electrodes. A chip interconnection structure is formed in the cavity to connect the first electrode with the second electrode. An encapsulation layer is formed covering the plurality of the second chips.

Another aspect of the present disclosure provides a wafer-level package structure. The package structure includes a first wafer. A plurality of first chips is formed in the first wafer. A surface of each first chip is integrated with a first electrode. A first dielectric layer is formed on the first wafer, exposing each first electrode. A plurality of second chips is aligned relative to the plurality of the first chips and bonded to the first wafer. A surface of the second chip that faces the first wafer is integrated with a second electrode, positioned relative to the first electrode. A second dielectric layer is formed on the plurality of the second chips that faces the first wafer, exposing each second electrode. A chip interconnection structure is formed between the first and the second electrodes. An encapsulation layer is formed to cover the plurality of the second chips. A through-hole interconnection structure is formed in the first wafer to electrically connect to the first chip.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for purpose of the illustration according to various disclosed embodiments and are not intended to limit the scope of the present disclosure.

DETAILED DESCRIPTION

Package structures are complicated. After bonding a bare chip to be integrated to a wafer, a first connection structure electrically connecting to the bare chip, a second connection structure electrically connecting to the chip on the wafer, and an interconnection structure connecting the first and the second connection structures are to be formed. The processes of forming such structures are complicated.

Additionally, before bonding a bare chip to a wafer, the bare chip is fixed within an injection molding layer formed by an injection molding process. The injection molding layer has to be removed or at least partially removed after the bare chip and the wafer are bonded. Such process steps are tedious.

The present disclosure provides a wafer-level packaging method with simplified processes and a package structure.

In the wafer-level packaging method, a first wafer is provided. A plurality of first chips is formed in the first wafer. A first electrode is integrated to the surface of the first chip. A first dielectric layer is formed on the first wafer exposing each first electrode. A plurality of second chips is provided. A second electrode is integrated to the surface of the second chip. A second dielectric layer is formed on the plurality of the second chips exposing each second electrode. The second dielectric layer is positioned relative to the first dielectric layer. The second chips are bonded to the first wafer with each second chip aligned relative to one first chip, and to form a cavity between the first and the second electrodes. A chip interconnection structure is formed in the cavity to connect the first and the second electrodes. An encapsulation layer is formed to cover the plurality of the second chips.

When bonding the second chip to the first wafer, the second chip is set positioned relative to the first chip to form a cavity between the first and the second electrodes, thereby forming a chip interconnection structure in the cavity to electrically connect the first and the second electrodes. The chip interconnection structure electrically connects the second chip with the first chip. There is no need to form an additional connection structure to electrically connect the second chip, thereby simplifying the packaging process.

Reference will now be made in detail to exemplary embodiments of the disclosure, which are illustrated in the accompanying drawings. Wherever possible, the same reference numbers will be used throughout the drawings to refer to the same or like parts.

FIGS. 1-8 illustrate schematic structures corresponding to certain stages during an exemplary wafer-level packaging method according to an embodiment of the present disclosure.

Figure 1:
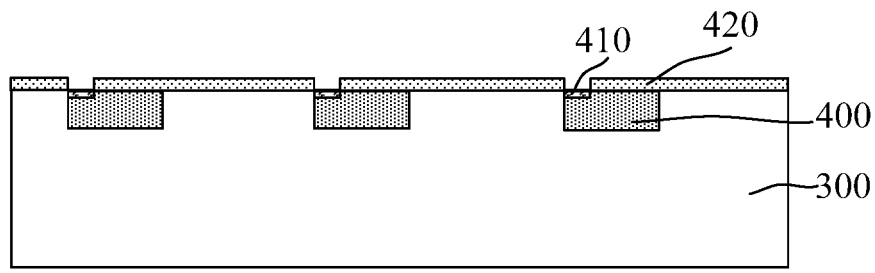
FIGS. 1-8 illustrate schematic structures corresponding to certain stages during an exemplary wafer-level packaging method according to an embodiment of the present disclosure.

As shown in FIG. 1, in the wafer-level packaging method, a first wafer 300 is provided; a plurality of first chips 400 is formed in the first wafer 300; a first electrode 410 is integrated to the surface of the first chip 400; and a first dielectric layer 420 is formed on the first wafer 300 exposing each first electrode 410.

The first wafer 300 may be a wafer, including devices, such as semiconductor devices, that have already been fabricated in/on the wafer. In one embodiment, the first wafer 300 is a device wafer (CMOS wafer) and a silicon substrate is used for a semiconductor substrate of the first wafer 300. In other embodiments, the semiconductor substrate may be made of other materials such as germanium, silicon germanium, silicon carbide, gallium arsenide, or indium gallium, etc. The semiconductor substrate may also be a silicon on insulator or a germanium on insulator. The semiconductor substrate may be chosen to meet process requirements and be of high integrability. Based on actual process requirements, the first wafer has a thickness in the range of 10 microns to about 100 microns.

A plurality of the first chips 400 formed in the first wafer 300 may be of the same type or different types. The first wafer 300 may be made by an integrated circuits (ICs) technology. For example, a deposition or an etching process is used on a first semiconductor substrate to form an N metal oxide semiconductor (NMOS) device or a P metal oxide semiconductor (PMOS) device, etc. A dielectric layer, a metal interconnection structure, and a pad connected to the metal interconnection structure, are formed on such a device. Thus, the first wafer 300 is integrated with at least one first chip 400.

The first electrode 410 positioned on the surface of the first chip 400 is for connecting the first chip 400 with any other suitable semiconductor devices. For example, the first electrode 410 may be a bond pad.

The first dielectric layer 420 has a certain thickness and may provide space to form a cavity in a subsequent bonding process. Also, the first dielectric layer 420 is electrically insulating and may insulate the chip interconnection structure from other components after the chip interconnection structure is formed in the cavity.

In one embodiment, the first dielectric layer 420 may be used as a bonding layer to physically bond the first wafer 300 with a chip that is to be integrated.

For example, in one embodiment, the first dielectric layer 420 functions as a first oxide layer that is a bonding layer for a subsequent fusion bonding process. In the fusion bonding process, chemical covalent bonds are formed between the contact surfaces of the bonding layers for surface bonding, thereby increasing the bonding strength.

In one embodiment, the first oxide layer is made of silicon oxide. The silicon oxide material is highly process compatible, commonly used, and of low cost. Thus, using silicon oxide material for the first oxide layer is beneficial for reducing process difficulties and process cost, and decreasing negative effects of the bonding process on performance of the package structure.

In other embodiments, the first oxide layer may also be made of an oxide material including hafnium oxide, aluminum oxide, or lanthanum oxide.

Figure 2:
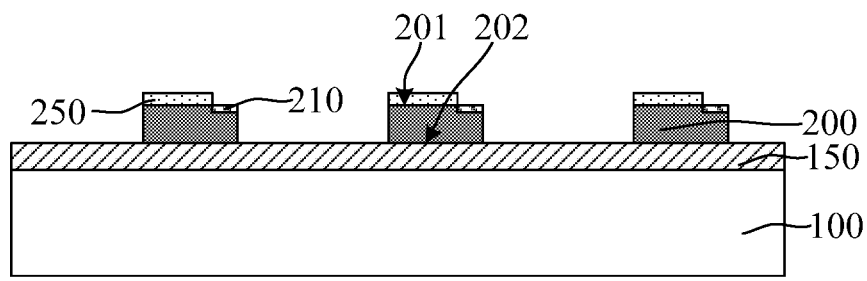

As shown in FIG. 2, a plurality of second chips 200 is provided. A second electrode 210 is integrated to the surface of each second chip 200. A second dielectric layer 250 is formed on the plurality of the second chips 200, exposing each second electrode 210.

The second chip 200 is a chip to be integrated in the WLSiP. In one embodiment, the packaging method of the WLSiP is to achieve a heterogeneous integration. Thus, the plurality of the second chips 200 may be made of silicon wafer, and may also be made of other materials.

A plurality of the second chips 200 may have different functionalities. The second chip 200 may be made by a ICs manufacturing technology. The second chip 200 may be a memory chip, a communication chip, a processing chip, or a logic chip. The second chip 200 may include NMOS device on semiconductor substrate or PMOS device on semiconductor substrate, etc.

The second electrode 210 positioned on the surface of the second chip 200 may function as a bond pad, for electrically connecting the second chip 200 with any other suitable semiconductor devices. For example, the second electrode 210 may be a bond pad.

The second dielectric layer 250 has a certain thickness and may provide space to form a cavity in a subsequent process. Also, the second dielectric layer 250 is electrically insulating. After forming a chip interconnection structure in the cavity, the second dielectric layer 250 may electrically insulate the chip interconnection structure from other components.

In one embodiment, the second dielectric layer 250 may also be used as a bonding layer to physically bond wafers that are to be integrated.

For example, the second dielectric layer 250 may be used as a second oxide layer that is a bonding layer in a subsequent fusion bonding process. In the fusion bonding process, the contact surfaces of the bonding layers form covalent bonds, accomplishing a strong interfacial bonding strength.

In one embodiment, the second oxide layer is made of silicon oxide. The silicon oxide material is highly process compatible, commonly used, and of low cost. Use of silicon oxide for an oxide layer is beneficial for decreasing process difficulties, lowering production cost, and further reducing negative effects on properties of the package structures.

In other embodiments, the second oxide layer may be made of hafnium oxide, aluminum oxide, or lanthanum oxide.

The surface of the second chip 200 that is integrated with the second electrode 210 is a front surface 201. A surface opposite to the front surface 201 is a back surface 202. In one embodiment of a process of forming a plurality of second chips 200, a second wafer 100 is provided. The back surfaces 202 of the plurality of the second chips 200 are temporarily bonded to the second wafer 100. For example, a plurality of the second chips 200 is formed on the second wafer 100, which is used as a carrier wafer to temporarily fixate the plurality of the second chips 200. The second wafer 100 may also be used in the process of bonding the second chip 200 with the first wafer 300 (as shown in FIG. 1) to provide support for the second chip 200, thereby increasing reliability of the bonding. After the second chip 200 and the first wafer 300 (shown in FIG. 1) are bonded, the second wafer 100 may be debonded and removed from the second chip 200.

In one embodiment, an adhesive layer 150 is formed on the second wafer 100. A plurality of the second chips 200 is temporarily bonded to the second wafer 100 through the adhesive layer 150.

The adhesive layer 150 may include one or two of a die attach film (DAF) and a dry film. The dry film is a viscous photoresist, commonly used for semiconductor chip packaging or for making printed electrical circuits boards. The dry film is made by coating a solvent-free photoresist onto a polyester base followed by covering a polyethylene thin film. The polyethylene film is removed before use. The photoresist is pressed onto a substrate before being passed through a light exposure and a developing process to form a pattern in the dry film.

In other embodiments, the second chip 200 may be temporarily bonded to the second wafer by an electrostatic bonding process. The electrostatic bonding requires no adhesive. In the process of electrostatic bonding, the second chip and the second wafer are connected separately with electrodes of opposite polarities. A voltage is applied to generate opposite charges on the surfaces of the second chip and the second wafer, thereby forming a strong electrostatic attraction to achieve a physical bonding between the second chip and the second wafer.

In one embodiment, the second wafer 100 is a carrier wafer to provide support for the second chip 200. In other embodiments, the second wafer 100 may not be needed.

Figure 3:
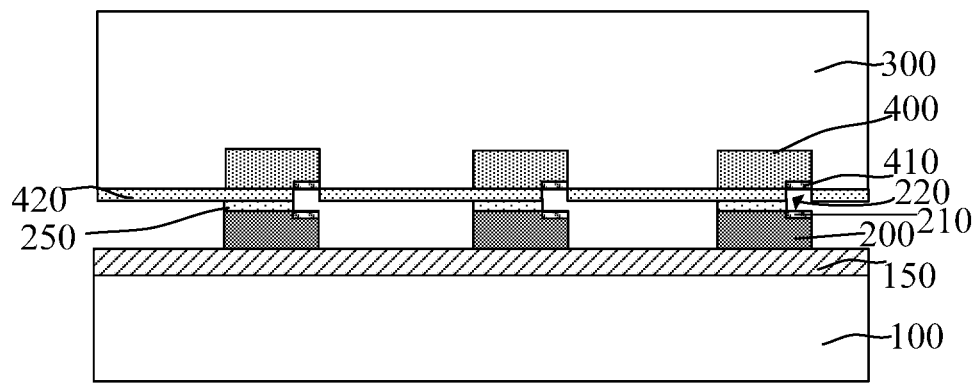

As shown in FIG. 3, the second dielectric layer 250 is positioned relative to the first dielectric layer 420. The second chips 200 are bonded to the first wafer 300 with each second chip aligned relative to the first chip 400 to form a cavity between the first electrode 410 and the second electrode 210.

Additionally, alignment of each second chip 200 relative to the first chip 400 refers to a mutual alignment of the second chip 200 with the first chip 400, along with an alignment of the second electrode 210 on each second chip 200 relative to the first electrode 410 on the first chip 400 when bonding the second chip 200 with the first chip 400.

When positioning and then attaching the second dielectric layer 250 with the first dielectric layer 420, because the second 250 and the first 420 dielectric layers have a certain thickness and provide support, the first electrode 410 exposed by the first dielectric layer 420 and the second electrode 210 exposed by the second dielectric layer 250 enclose a cavity 220. The cavity 220 may be filled with conductive material to form a chip interconnection structure connecting the first electrode 410 with the second electrode 210.

In one embodiment, the first electrode 410 is positioned along an edge of the first chip 400; and the second electrode 210 is positioned along an edge of the second chip 200. When positioning the second dielectric layer 250 relative to the first dielectric layer 420, the second chip is aligned relative to the first chip. The first electrode 410, the first dielectric layer 420, the second dielectric layer 250, and the second chip 200 enclose a cavity. Additionally, a portion of the second dielectric layer 250 around the perimeter of the second electrode 210 is not in contact with the first dielectric layer 420, thereby forming an opening for the cavity between the second electrode 210 and the first dielectric layer 420.

In one embodiment, the back surface 202 (shown in FIG. 2) of the second chip 200 is temporarily bonded to the second wafer 100 and the second dielectric layer 250 is positioned relative to the first dielectric layer 420. The process of bonding the second chip 200 to the first wafer 300 includes: positioning the second wafer 100 relative to the first wafer 300 before bonding the front surface 201 (shown in FIG. 2) of the second chip 200 on the second wafer 100 with the first wafer 300. In the bonding process, the second wafer 100 may provide strong support for the second chip 200, thereby increasing reliability of the bonding between the first chip 400 and the second chip 200.

In one embodiment, the second dielectric layer 250 functions as a first oxide layer and the first dielectric layer 420 functions as a second oxide layer. The second chip 200 is bonded with the first wafer 300 through bonding the first and the second oxide layers using a fusion bonding process. For example, the first and second oxide layers are made of silicon oxide. The second chip 200 and the first wafer 300 are physically bonded through silicon oxide-silicon oxide fusion bonding.

The fusion bonding process proceeds by an interfacial chemical bonding. In the fusion bonding process, the contact surfaces of the first and the second oxide layers are activated to form covalent bonds between the contact surfaces for bonding. As a result, the first and the second oxide layers achieve a strong bonding strength and the benefit of an increased WLSiP package production yield.

In other embodiments, the second chip 200 and the first wafer 300 may be bonded by other bonding processes, such as an adhesive bonding or a glass frit bonding.

For example, the process temperature of adhesive bonding is low and adhesive bonding is compatible with CMOS to enable the wafer to be bonded in a heterogeneous integration process. The adhesive bonding process includes: forming an adhesive layer on bonding surfaces of a chip and a wafer. The adhesive is usually made of a polymer material. By gentle baking or using a polymer precursor, the adhesive is in a non-polymerized or partially polymerized state. The chip and the wafer are aligned in a chamber before being pulling vacuum. The contact surfaces of the chip and the wafer are brought into close contact. Pressure is applied to bond the contact surfaces of the chip and the wafer.

Glass frit bonding refers to printing a glass solder on a wafer to form a closed loop, and pre-sintering the wafer in a reflux furnace. After the pre-sintering process, the wafer is aligned with a chip that is positioned within the closed loop. The wafer and the chip are sintered in a bonding machine to form a sealed cavity. The glass frit bonding process is simple, producing high bonding strength and a good sealing effect, thereby suitable for large scale production.

Figure 4:
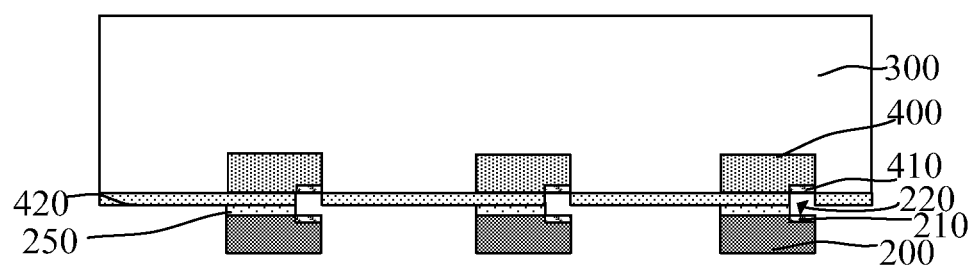

As shown in FIG. 4, after forming the cavity 220, the second wafer 100 (shown in FIG. 3) is debonded to separate the second wafer 100 from the second chip 200.

In one embodiment, the second wafer 100 is attached to the second chip 200 through an adhesive layer 150 (shown in FIG. 3). Correspondingly, in a debonding process, the second wafer 100 may be debonded from the second chip 200 by a chemical method or a mechanical stripping.

In other embodiments, the second wafer 100 may be separated from the second chip 200 by other means.

Figure 5:
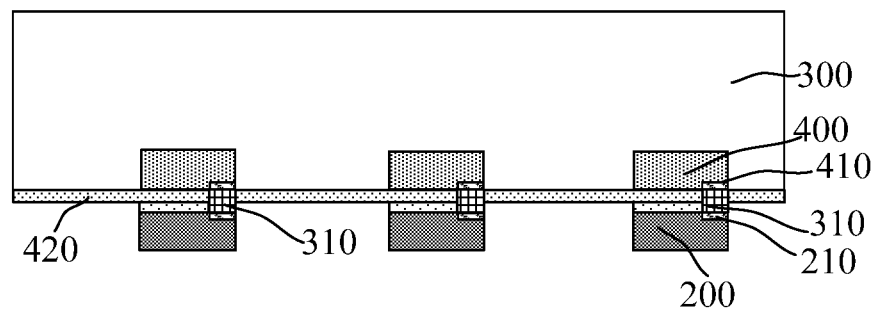

As shown in FIG. 5, a chip interconnection structure 310 is formed in the cavity 220 (shown in FIG. 4) to electrically connect the first 410 electrode with the second electrode 210.

The chip interconnection structure 310 is filled in the cavity 220 (shown in FIG. 4) and is in contact with the first 410 and the second 210 electrodes, therefore forming electrical contacts of the first 410 and the second 210 electrodes, and accomplishing an electrical connection of the first 400 and the second 200 chips.

The chip interconnection structure 310 may be formed using an electroplating process. The chip interconnection structure 310 formed by electroplating provides good filling effect in the cavity 220 (shown in FIG. 4) and increases reliability of the electrical connection between the first 410 and the second 210 electrodes.

In one embodiment, the electroplating process is electroless plating. For example, after being bonded, the second chip 200 and the first wafer 300 are placed in a metal ion solution (for example, a chemical plating solution of silver, nickel, or copper). Based on the principle of reduction-oxidation reactions, a strong reducing agent is used to reduce the metal ions to metal that is to be deposited onto the surfaces of the first electrode 410 or the second electrode 210, forming a metal plating. After a period of reaction time, the metal plating fills up the cavity 220 to form the chip interconnection structure 310. The chip interconnection structure 310 contacts both the first 410 and the second 210 electrodes, accomplishing electrical connection of the second chip 200 with the first wafer 300.

The chip interconnection structure 310 may be made of a material including copper, nickel, zinc, tin, silver, gold, tungsten, magnesium, or a combination thereof.

For example, the chip interconnection structure 310 may include a welded connection block.

Figure 6:
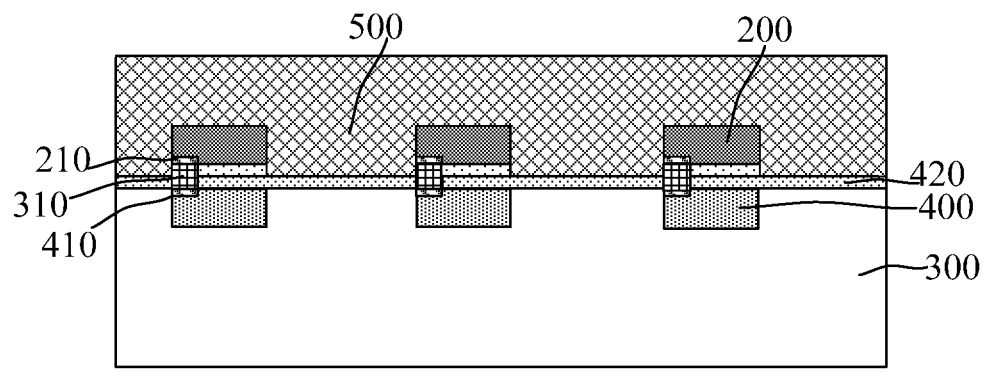

As shown in FIG. 6, an encapsulation layer 500 is formed to cover the plurality of the second chips 200.

In one embodiment, the encapsulation layer 500 covers the second chips 200. Also, the encapsulation layer 500 fills in the gaps among a plurality of the second chips 200 and covers the first dielectric layer 420 on the first wafer 300. The encapsulation layer 500 may contact the first dielectric layer 420 to form a seal hermetically isolating air and water vapor well, thereby improving the encapsulation effect of the package structure.

For example, the encapsulation layer 500 may be formed by an injection molding process. Injection molding has good filling performance. The injection molding agent fills the gaps among a plurality of the second chips 200 well, thereby achieving good encapsulation effect of the second chips 200.

In other embodiments, the encapsulation layer may be formed by other processes.

Figure 7:
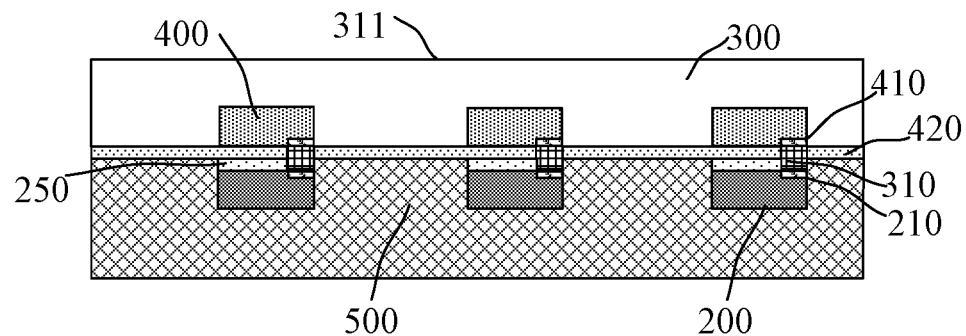
Figure 8:
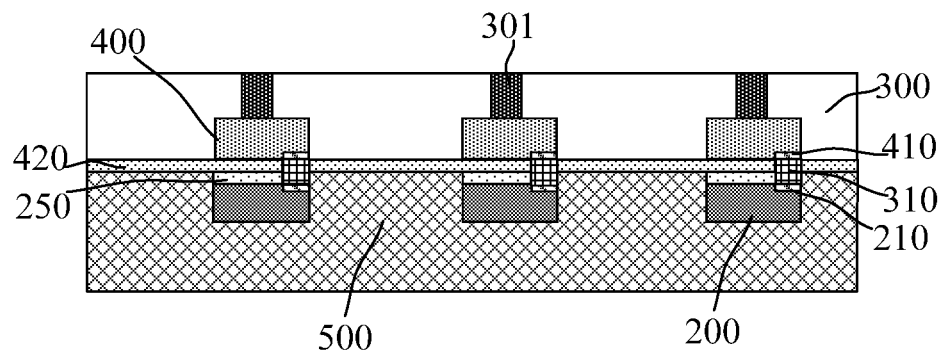

As shown in FIGS. 7 and 8, a through-hole interconnection structure 301 is formed on the first wafer 300 electrically connecting to the first chip 400.

For example, as shown in FIG. 7, the surface of the first wafer 300 opposite to the first dielectric layer 420 is a back surface 311. The packaging method may further include the following step: after forming the encapsulation layer 500 that covers the second chips 200, thinning the first wafer 300 from the back surface 311 of the first wafer 300.

After the thinning process on the back surface 311, thickness of the first wafer 300 is reduced, improving heat dissipation effect of the first wafer 300. Also, a decreased thickness of the first wafer 300 is beneficial in decreasing process difficulties of forming the through-hole interconnection structure and decreasing overall thickness of the package structure, thereby further increasing performance of the package structure.

In one embodiment, the thinning process is conducted using a process including backside polishing process, chemical mechanical polishing (CMP), or wet etching, or a combination of the above processes.

For effectively controlling the stop position of the thinning process, a deep trench separation structure for delimiting the stop position may be formed in the semiconductor substrate of the first wafer 300, thereby allowing for the thinning process to stop at bottom of the deep trench separation structure.

In another embodiment, in the first wafer 300 manufacturing process, neutral doping ions, for example, oxygen ions or nitrogen ions, or a combination of both, are used to form a stop zone in the semiconductor substrate of the first wafer 300, thereby allowing for the thinning process to stop at the stop zone.

In other embodiments, when the semiconductor substrate of the first wafer is a silicon on insulator or a germanium on insulator, the bottom layer of the semiconductor substrate may be thinned to enable the thinning process to stop precisely at the bottom of the insulator.

After the thinning process, the thickness of the first wafer 300 is limited in a range. If the thickness is too thin, mechanical properties of the first wafer 300 would not be sufficient, causing negative effects on the devices formed in the first wafer 300. In contrast, if the thickness is too thick, performance of the package structure would be compromised. In one embodiment, the first wafer 300 has a thickness in the range of 5 μm to 10 μm.

After the thinning process, a through-hole interconnection structure 301 that electrically connects to the first chip 400 is formed in the first wafer 300. By the through-hole interconnection structure 301, the first chip 400 is electrically connected with any other suitable circuits. The first chip 400 and the second chip 200 are electrically connected through the chip interconnection structure 310. Thus, the second chip 200 is electrically connected with other circuits through the chip interconnection structure 310, the interconnection structure formed in the first chip 400, and the through-hole interconnection structure 301.

A surface of the first chip 400 integrated with a first electrode 410 is a front surface. A surface opposite to the front surface is a back surface. In one embodiment, the through-hole interconnection structure 301 is in contact with the back surface to electrically connect the through-hole interconnection structure 301 with the first chip 400.

In one embodiment, the through-hole interconnection structure 301 is formed in the silicon substrate of the first wafer 300 using a through-silicon via technology. In other embodiments, the through-hole interconnection structure may be formed using other processes.

In one embodiment, the through-hole interconnection structure 301 is made of copper. In other embodiments, the through-hole interconnection structure 301 may be made of other conductive materials including aluminum, tungsten, or titanium.

In one embodiment of an exemplary packaging method, before forming the chip interconnection structure to connect the first and the second electrodes in the cavity, the second wafer is debonded. In other embodiments, the second wafer may be debonded after forming the chip interconnection structure to connect the first and the second electrodes in the cavity and before forming the encapsulation layer to cover the plurality of the second chips.

The present disclosure provides a wafer-level package structure. FIG. 8 illustrates a schematic structure of the package structure according to one embodiment.

The package structure includes a first wafer 300 and a plurality of first chips 400 formed in the first wafer 300. A first electrode 410 is integrated with the surface of the first chip 400. A first dielectric layer 420 is formed on the first wafer 300 exposing each first electrode 410. A plurality of second chips 200 is bonded to the first wafer 300 and aligned relative to the plurality of the first chips 400. The surface of each second chip 200 that faces the first wafer 300 is integrated with a second electrode 210. A second dielectric layer 250 is formed on the plurality of the second chips 200 that face the first wafer 300, exposing each second electrode 210. The second electrode 210 is aligned relative to the first electrode 410. A chip interconnection structure 310 is positioned between the first 410 and second 210 electrodes. An encapsulation layer 500 covers the plurality of the second chips 200. A through-hole interconnection structure 301 is formed in the first wafer 300 and electrically connects to the first chip 400.

In one embodiment of the package structure, a plurality of the first chips 400 is formed in the first wafer 300. A surface of each first chip 400 is integrated with a first electrode 410. The package structure includes a plurality of second chips 200 bonded to the first wafer 300 and aligned relative to the plurality of the first chips 400. A surface of each second chip 200 is integrated with a second electrode 210. Each second electrode 210 is aligned relative to one first electrode 410. A chip interconnection structure 310 is positioned between the first 410 and second 210 electrodes, electrically connecting the first chip 400 with the second chip 200. The first chip 400 electrically connects with any suitable external electric circuits through the through-hole interconnection structure 301. The second chip 200 is electrically connected with any suitable external electric circuits through the chip interconnection structure 310, the interconnection structure in the first chip 400, and the through-hole interconnection structure 301. There is no need to form additional connection structure to electrically connect the second chip 200, thereby simplifying the package structure.

The first wafer 300 may be a wafer, including devices, such as semiconductor devices, that have already been fabricated in/on the wafer. In one embodiment, the first wafer 300 is a device wafer (CMOS Wafer) and a silicon substrate is used as a semiconductor substrate of the first wafer 300. In other embodiments, the semiconductor substrate may be made of germanium, silicon germanium, silicon carbide, gallium arsenide, or indium gallium, etc. The semiconductor substrate may also be a silicon on insulator or a germanium on insulator. In the package structure, the first wafer 300 is a wafer after a thinning process and has a thickness in the range of 5 µm to 10 µm.

The plurality of the first chips 400 in the first wafer 300 may be any suitable chips of the same type or of different types.

The first wafer 300 may be made by an ICs manufacturing technology. For example, a deposition or an etching process is conducted on a semiconductor substrate to form an NMOS device on the semiconductor substrate or a PMOS device on the semiconductor substrate, etc. A dielectric layer, a metal interconnection structure, and a pad electrically connected to the metal interconnection structure, etc., are formed on such a device. Thus, the first wafer 300 is integrated with at least one first chip 400.

A first electrode 410, positioned on the surface of the first chip 400, is to electrically connect the first chip 400 with other semiconductor devices. For example, the first electrode 410 may be a bond pad.

The first dielectric layer 420 may be used as an insulator between the chip interconnection structure 310 and other devices. In one embodiment, the first dielectric layer 420 is also used as a bonding layer to physically connect the first wafer 300 with chips that are to be integrated.

The second chip 200 includes a chip to be integrated in the WLSiP. In one embodiment, the package structure includes a heterogeneous integration. Thus, the plurality of the second chips 200 may be made of silicon wafer and may also be made of other materials.

There is a plurality of the second chips 200. The plurality of the second chips 200 may have different functionalities, which may be made by an ICs manufacturing technology. The second chip 200 may be a memory chip, a communication chip, a processing chip, or a logic chip. The second chip 200 may include an NMOS device on semiconductor substrate or a PMOS device on semiconductor substrate.

The second electrode 210 on the second chip 200 may be a bond pad for electrically connecting the second chip 200.

The second dielectric layer 250 may function to insulate the chip interconnection structure 310 from other devices. In one embodiment, the second dielectric layer 250 functions as a bonding layer to physically bond wafers that are to be integrated.

In one embodiment, the second dielectric layer 250 functions as a second oxide layer. The second chip 200 is bonded to the first wafer 300 through bonding the first oxide layer with the second oxide layer using a fusion bonding process. The fusion bonding process proceeds by an interfacial chemical bonding. In the fusion bonding, the contact surfaces of the first and the second oxide layers are activated, increasing dangling bonds on the first and the second oxide layers, enabling to form covalent bonds between the contact surfaces for bonding. As a result, the first and the second oxide layers achieve a strong bonding strength, with the benefit of an increased reliability of the package structure.

In other embodiments, the second chip may be bonded to the first wafer by adhesive bonding or glass frit bonding.

For example, process temperature of the adhesive bonding is low and the adhesive bonding is compatible with CMOS to enable the wafer to be bonded in a heterogeneous integration process. The adhesive bonding process includes forming an adhesive layer on bonding surfaces of a chip and a wafer. The adhesive is usually made of a polymer material. By gentle baking or applying a polymer precursor, the adhesive is in a non-polymerized or partially polymerized state. The chip and the wafer are aligned in a chamber before being pulled vacuum. The bonding surfaces of the chip and the wafer are brought into contact. A pressure is applied to closely bond the contact surfaces of the chip and the wafer.

In a glass frit bonding process, a glass solder is printed on a wafer to form a closed loop and the wafer is pre-sintered in a reflux furnace. After the pre-sintering process, the wafer is aligned with a chip that is positioned within the closed loop. The wafer and the chip are sintered in a bonding machine to form a sealed cavity. The glass frit bond process is simple, producing high bonding strength and a good sealing effect, thereby suitable for large scale production.

In one embodiment, the first 420 and the second 250 dielectric layers are made of silicon oxide. The silicon oxide material is highly process compatible, commonly used, and of low cost. Thus, using silicon oxide material is beneficial for reducing process difficulties and process cost, and decreasing negative effects of the process on performance of the package structure.

The chip interconnection structure 310 includes an electroplated chip interconnection structure. In other words, the chip interconnection structure 310 may be formed by an electroplating process, which fills in the gaps between the first 410 and the second 210 electrodes well, thereby further increasing reliability of the electrical connection of the first 410 and the second 210 electrodes.

For example, the chip interconnection structure 310 may be made of a material including copper, nickel, zinc, tin, silver, gold, tungsten, magnesium, or a combination thereof.

An encapsulation layer 500 covers the plurality of the second chips, fills in the gaps among the second chips 200, covers the first dielectric layer 420 on the first wafer 300, and seals by contact with the first dielectric layer 420, thereby well hermetically isolating air and water vapor well and improving the encapsulation effect of the package structure.

The through-hole interconnection structure 301 positioned in the first wafer 300 electrically connects to the first chip 400. The first chip 400 is electrically connected with other electric circuits through the through-hole interconnection structure 301 and is electrically connected with the second chip 200 through the chip interconnection structure 310. Thus, the second chip 200 is electrically connected with other electric circuits through the chip interconnection structure 310, the interconnection structure formed in the first chip 400, and the through-hole interconnection structure 301.

A surface of the first chip 400 integrated with a first electrode 410 is a front surface. A surface opposite to the front surface is a back surface. The through-hole interconnection structure 301 is in contact with the back surface to be electrically connected to the first chip 400. In one embodiment, the first wafer 300 is a semiconductor substrate and the through-hole interconnection structure is a through-silicon via interconnection structure.

In one embodiment, the through-hole interconnection structure 301 is made of copper. In other embodiments, the through-hole interconnection structure 301 may be made of other conductive materials including aluminum, tungsten, or titanium.

Optionally, the surface of the second chip that is integrated with a second electrode is a front surface and a surface opposite to the front surface is a back surface. Before bonding the second chip to the first wafer, the back surfaces of a plurality of the second chips are bonded to a second wafer. Before forming an encapsulation layer to cover the plurality of the second chips, the second wafer is debonded from the plurality of the second chips.

Optionally, a plurality of the second chips is temporarily bonded to the second wafer by an adhesive layer or electrostatic process.

Optionally, before forming a chip interconnection structure in the cavity to connect the first and the second electrodes, the second wafer is debonded.

Optionally, after forming a chip interconnection structure and before forming an encapsulation layer, the second wafer is debonded.

Optionally, the second chip is bonded to the first wafer by a process including fusion bonding, adhesive bonding, or glass frit bonding.

Optionally, the first and the second dielectric layers are made of silicon oxide.

Optionally, forming an encapsulation layer to cover the plurality of the second chips includes an injection molding process.

Optionally, a surface of the first wafer that faces away from the first dielectric layer is a back surface. After forming an encapsulation layer, the back surface of the first wafer is thinned. A through-hole interconnection structure is formed on the thinned first wafer.

Optionally, the first electrode is positioned along an edge of the first chip. The second electrode is positioned along an edge of the second chip. When positioning the second dielectric layer relative to the first dielectric layer, a cavity is enclosed by the first electrode, the first dielectric layer, the second dielectric layer, and the second chip. An opening of the cavity is formed between the second electrode and the first dielectric layer.

Optionally, the chip interconnection structure is formed by an electroplating process.

Optionally, the electroplating process is an electroless plating process.

Optionally, the chip interconnection structure is made of a material including copper, nickel, zinc, tin, silver, gold, tungsten, magnesium, or a combination thereof.

Optionally, the second chip is bonded to the first wafer by a process including fusion bonding, adhesive bonding, or glass frit bonding.

Optionally, the first and the second dielectric layers are made of silicon oxide.

Optionally, the encapsulation layer includes an injection molding layer.

Optionally, the chip interconnection structure includes an electroplated chip interconnection structure.

Optionally the chip interconnection structure is made by a material including copper, nickel, zinc, tin, silver, gold, tungsten, magnesium, or a combination thereof.

Optionally, the first wafer has a thickness in the range of 5 μm to 10 μm.

Compared to conventional wafer-level packaging technology, the present disclosure has the following advantages.

When bonding the second chip to the first wafer, the second chip is aligned relative to the first chip to form a cavity between the first electrode and the second electrode. A chip interconnection structure is formed in the cavity electrically connecting the first electrode with the second electrode. In the present disclosure, there is no need to form an additional connection structure to connect the second chip, thereby simplifying the packaging method.

In the wafer-level package structure of the present disclosure, a plurality of first chips is formed in the first wafer. A surface of each first chip is integrated with a first electrode. The package structure also includes a plurality of second chips bonded to the first wafer and aligned relative to the plurality of the first chips. A surface of each second chip is integrated with a second electrode. The second electrode is positioned relative to the first electrode. A chip interconnection structure is formed between the first electrode and the second electrode to electrically connect the first chip with the second chip. There is no need to form an additional connection structure to connect the second chip, thereby simplifying the package structure.

The embodiments disclosed herein are exemplary only. Other applications, advantages, alternations, modifications, or equivalents to the disclosed embodiments are obvious to those skilled in the art and are intended to be encompassed within the scope of the present disclosure. The protection of the present disclosure is limited by the scope of the claims only.

What is claimed is:

1. A wafer-level packaging method, comprising:
providing a first wafer; forming a plurality of first chips in the first wafer with a front surface of a first chip at a front surface of the first wafer, a first electrode being integrated within the first chip and at the front surface of the first chip; and forming a first dielectric layer on a surface of the first wafer, the first dielectric layer exposing each first electrode;
providing a plurality of second chips, a surface of each second chip being integrated with a second electrode; and forming a second dielectric layer on the plurality of second chips, the second dielectric layer exposing each second electrode;
positioning the second dielectric layer relative to the first dielectric layer;
bonding the plurality of the second chips to the first wafer, wherein each second chip is aligned relative to one first chip to form a cavity between the first and the second electrodes;
forming a chip interconnection structure in the cavity to electrically connect the first electrode with the second electrode; and
forming an encapsulation layer to cover the plurality of the second chips.

2. The method according to claim 1, wherein:
the surface of the second chip integrated with the second electrode is a front surface;
a surface opposite to the front surface is a back surface;
before bonding the plurality of second chips to the first wafer, temporarily bonding the back surfaces of the plurality of the second chips with a second wafer; and
before forming the encapsulation layer to cover the plurality of the second chips, debonding the second wafer from the plurality of the second chips.

3. The method according to claim 2, wherein:
the plurality of the second chips are temporarily bonded with the second wafer through an adhesive bonding layer or using an electrostatic bonding process.

4. The method according to claim 2, further including:
before forming the chip interconnection structure in the cavity to connect the first electrode with the second electrode, debonding the second wafer.

5. The method according to claim 2, further including:
after forming the chip interconnection structure and before forming the encapsulation layer, debonding the second wafer.

6. The method according to claim 1, wherein:
the second chip is bonded to the first wafer using a process of fusion bonding, adhesive bonding, or glass frit bonding.

7. The method according to either claim 1, wherein:
each of the first dielectric layer and the second dielectric layer is made of a material including silicon oxide.

8. The method according to claim 1, wherein:
forming the encapsulation layer to cover the plurality of second chips includes an injection molding process.

9. The method according to claim 1, wherein:
a surface of the first wafer opposite to the first dielectric layer is a back surface;
after forming the encapsulation layer, the back surface of the first wafer is thinned; and
after the thinning process, a through-hole interconnection structure is formed in the first wafer.

10. The method according to claim 1, wherein:
the first electrode is positioned along an edge of the first chip;
the second electrode is positioned along an edge of the second chip;
when positioning the second dielectric layer relative to the first dielectric layer, the second chip is aligned relative to the first chip; and a cavity is enclosed by the first electrode, the first dielectric layer, the second dielectric layer, and the second chip; and
an opening for the cavity is formed between the second electrode and the first dielectric layer.

11. The method according to claim 1, wherein:
forming the chip interconnection structure includes an electroplating process.

12. The method according to claim 11, wherein the electroplating process includes an electroless plating process.

13. The method according to claim 1, wherein:
the chip interconnection structure is made of a material including copper, nickel, zinc, tin, silver, gold, tungsten, magnesium, or a combination thereof.

14. A wafer-level package structure, comprising:
a first wafer;
a plurality of first chips, formed in the first wafer and having a front surface of each first chip at a front surface of the first wafer;
a first electrode, integrated within the first chip and at the front surface of the first chip;
a first dielectric layer, formed on the first wafer and exposing the first electrode;
a plurality of second chips, bonded to the first wafer and aligned relative to the plurality of the first chips;
a second electrode, integrated to a surface, facing the first wafer, of the second chip and positioned relative to the first electrode;
a second dielectric layer, formed on the surface, facing the first wafer, of the second chip and exposing the second electrode;
a chip interconnection structure, formed between the first electrode and the second electrode; and
an encapsulation layer covering the plurality of the second chips.

15. The structure according to claim 14, wherein:
the second chip is bonded with the first wafer by a process of fusion bonding, adhesion bonding, or glass frit bonding.

16. The structure according to either claim 14, wherein:
each of the first dielectric layer and the second dielectric layer is made of a material including silicon oxide.

17. The structure according to claim 14, wherein:
the encapsulation layer includes an injection molding layer.

18. The structure according to claim 14, wherein:
the chip interconnection structure includes an electroplated chip interconnection structure.

19. The structure according to claim 14, wherein:
the chip interconnection structure is made of a material including copper, nickel, zinc, tin, silver, gold, tungsten, magnesium, or a combination thereof.

20. A wafer-level packaging method, comprising:
providing a first wafer; forming a plurality of first chips in the first wafer, a surface of each first chip being integrated with a first electrode; and forming a first dielectric layer on a surface of the first wafer, the first dielectric layer exposing each first electrode;
providing a plurality of second chips, a front surface of each second chip being integrated with a second electrode, a back surface being opposite to the front surface; and forming a second dielectric layer on the plurality of second chips, the second dielectric layer exposing each second electrode;

positioning the second dielectric layer relative to the first dielectric layer;

before bonding the plurality of second chips to the first wafer, temporarily bonding the back surfaces of the plurality of the second chips with a second wafer;

bonding the plurality of the second chips to the first wafer, wherein each second chip is aligned relative to one first chip to form a cavity between the first and the second electrodes;

forming a chip interconnection structure in the cavity to electrically connect the first electrode with the second electrode;

before forming an encapsulation layer, debonding the second wafer from the plurality of the second chips; and forming the encapsulation layer to cover the plurality of the second chips.

* * * * *